United States Patent [19]

Smith

[11] Patent Number: 4,952,240

[45] Date of Patent: Aug. 28, 1990

[54] SCRATCH REMOVER AND POLISH CONTAINING OLEIC DIETHANOLAMIDE, AN ABRASIVE ALUMINA AND A BENTONITE

[75] Inventor: Ray E. Smith, Orlando, Fla.

[73] Assignee: Pro-Max Performance, Inc., Memphis, Tenn.

[21] Appl. No.: 366,634

[22] Filed: Jun. 15, 1989

[51] Int. Cl.$^5$ .......................... C09G 1/02; C09G 1/18
[52] U.S. Cl. ............................ 106/8; 106/3; 106/11; 148/22; 51/304; 51/306; 51/307; 51/308; 51/309
[58] Field of Search ................. 106/11, 8, 3; 252/544, 252/155, 154, 548, 144

[56] References Cited

U.S. PATENT DOCUMENTS

| | | | |
|---|---|---|---|
| 1,997,989 | 4/1935 | Witzel | 148/22 |
| 2,691,593 | 10/1954 | Avedikian | 106/5 |
| 2,807,584 | 9/1957 | Rushton | 252/91 |
| 3,240,715 | 3/1966 | Foley | 252/152 |
| 3,966,432 | 6/1976 | Rayner | 51/308 |
| 4,640,713 | 3/1987 | Harris | 106/3 |
| 4,853,000 | 8/1989 | Potter | 51/309 |

OTHER PUBLICATIONS

Flick, "Household, Automotive, and Industrial Chemical Formulations" 2nd Ed., 1984, (pp. 257, 282).

McCutcheon's Detergents and Emulsifiers, North American Ed., 1978 Annual, (pp. 89, 100, 226).

*Primary Examiner*—Dennis Albrecht
*Assistant Examiner*—Scott L. Hertzog
*Attorney, Agent, or Firm*—Macdonald J. Wiggins

[57] ABSTRACT

A compound containing a tall oil fatty acid, oleic diethanol amide, aluminum oxide abrasive material, and organo-treated bentonite provides a polish for metals, such as aluminum, having a uniform viscosity and the abrasive particles uniformly dispersed throughout the carrier. Water may be added to form a scratch removing compound. Mineral spirits may be substituted for the fatty acid in the scratch remover to form a prepolish compound.

4 Claims, No Drawings

SCRATCH REMOVER AND POLISH CONTAINING OLEIC DIETHANOLAMIDE, AN ABRASIVE ALUMINA AND A BENTONITE

BACKGROUND OF THE INVENTION

1. Field of the Invention

The present invention relates to metal polishes, and more particularly to an improved polish for aluminum and similar metals that removes scratches and provides a high, mirror polished surface.

2. Description of the Prior Art

Known metal polishes include abrasives which perform the function of leveling and smoothing the metal surface. Although fine particles of abrasive material may be used, it is difficult to maintain the particles dispersed throughout the carrier. It is common for the viscosity of the polish to vary throughout the compound, resulting in clumping of the abrasive particles. The clumped abrasive may thus produce fine scratches in the finish.

There is thus a need for a polishing compound in which fine abrasive particles are uniformly dispersed throughout a carrier, and in which a uniform viscosity is maintained to prevent settling or clumping of the particles.

SUMMARY OF THE INVENTION

The present invention utilizes an abrasive, such as aluminum oxide, with a particle size in the range of 0.1–1.0 microns. The carrier includes water insoluble fatty acid, emulsifying agents, rheological agents for control of viscosity and extension of shelf life, and solvents.

A typical formulation in accordance with the invention includes: tall oil fatty acid in a range of 30%–65% by weight; oleic diethanol amide in a range of 2%–10% by weight; and polishing grade aluminas in the range of 30%–60% by weight. Up to 3% by weight of organo-treated bentonite may be added.

Alternatively, 10%–33% by weight of an aliphatic hydrocarbon solvent may be substituted for the tall oil fatty acids and water used as a solvent.

The above formulation has been found to provide an excellent abrasive action on aluminum without scratching. When applied to an oxidized surface, rubbing of the surface with the formulation breaks the oxide, converting it to a black residue. The residue is removed with a clean cloth, leaving a shining, lustrous surface. A synergistic effect among the ingredients is believed to enhance the effectiveness of the polish over known prior art polishes. The oleic diethanol amide aids in producing a uniform dispersion of the aluminum oxide in the tall oil fatty acid and ensures complete wetting of the metal surface which increases luster. The organo-treated bentonite ensures a high, uniform viscosity. The tall oil fatty acid assists the aluminum oxide in cutting oxidation on an aluminum surface and lubricates the surface during polishing. The organic amide, which is cationic, also aids in producing the mirror finish on a polished aluminum surface. The emulsifier results in a more complete wetting of the surface of the metal. This action also assists the polishing ingredients in producing the desired mirror finish.

An implementation of the invention that serves as a scratch remover for metal surfaces may contain 30% to 60% by weight of tall oil fatty acid; 2% to 10% by weight of oleic diethanol amide; 30% to 60% by weight of 19 grit aluminum oxide; 15% to 30% water; and up to 3% by weight of organo-treated bentonite. This formulation produces a white, viscous liquid that is effective in removing scratches from aluminum and similar metals, and may be effectively used as a prepolish compound.

It is therefore a principal object of the invention to provide an improved metal polish that imparts a mirror finish without observable scratches to aluminum and similar metals.

It is another object of the invention to provide a metal polish in which the abrasive particles are uniformly dispersed throughout the carrier to eliminate scratching due to settling or clumping of the abrasive particles.

It is still another object of the invention to provide a metal polish having a high, uniform viscosity and including a emulsifier for complete wetting of the metal surface to provide an enhanced mirror finish to the metal surface.

It is yet another object of the invention to provide a scratch remover to be used on a metal surface prior to polishing.

These and other objects and advantages will become apparent from the following detailed description.

DETAILED DESCRIPTION OF THE PREFERRED EMBODIMENT

The preferred embodiment of the invention is formulated in accordance with the following Example 1.

EXAMPLE 1

The ingredients and proportions for the preferred embodiment are as follows:

45% by weight of tall oil fatty acid;
5% by weight of oleic diethanol amide;
47% by weight of 19 grit 1.0 micron aluminum oxide; and
3% by weight of organo-treated bentonite.

The tall oil fatty acid may be Acintol ® FA-3, available from Arizona Chemical Company; Panama City, Fla. Oleic diethanol amide is available under the trade name Witcamide TM 511 from Witco; Organics Division; Houston, Tex. Polishing grade aluminas are available from ALCOA; Pittsburgh, Pa. The organo-treated bentonite is available as Bentone ® SD-3 from N. L. Industries of Hightstown, N.J.

The steps in preparing the above formulation are as follows:

1. To Acinol ® FA-3 in a mixing tank at 70°–90° F., add Witcamide ®1. Mix until the mass is uniform.
2. Add aluminum oxide to the mixture while mixing thoroughly. Mix until a white, opaque dispersion is obtained.
3. Add Bentone ® SD-3 slowly. Mix until a uniform dispersion and large increase in viscosity occurs.

ALTERNATIVE EMBODIMENTS

A scratch remover compound having a water base may be compounded in accordance with the invention as shown in the following Example 2.

EXAMPLE 2

The ingredients and proportions for the scratch remover are as follows:

55% by weight Acintol ® FA-3;
6.7% by weight Witcamide ® 511;

15% by weight 19 grit - 0.1 micron aluminum oxide;
21.8% by weight water; and
1.5% by weight Bentone ® SD-3.

The steps in preparing the above formulation are as follows:

1. To Acinol ® FA-3 in a mixing tank at 70°-90° F., add Witcamide ® 511 and mix until completely dissolved.
2. Add aluminum oxide to the mixture and mix until a uniform dispersion is achieved.
3. Add water slowly while stirring rapidly, without permitting water to puddle on the surface.
4. Add Bentone ® slowly, permitting the added material to mix before increasing the amount. Continue stirring for one hour to allow viscosity to increase.

When compounding is complete, a white, viscous liquid results.

An effective prepolish compound for metals may be formulated in accordance with the following Example 3.

EXAMPLE 3

The ingredients and proportions for the prepolish compound are as follows:

55% by weight Mineral spirits;
6.7% by weight Witcamide ® 511;
15% by weight 19 grit - 0.1 micron aluminum oxide;
21.8% by weight water; and
1.5% by weight Bentone ® SD-3.

The steps in preparing the above formulation are as follows:

1. To mineral spirits in a mixing tank at 70°-90° F., add Witcamide ® 511 and mix until completely dissolved.
2. Add aluminum oxide to the mixture and mix until a uniform dispersion is achieved.
3. Add water slowly while stirring rapidly, without permitting water to puddle on the surface.
4. Add Bentone ® slowly, permitting the added material to mix before increasing the amount. Continue stirring for one hour to allow viscosity to increase.

The finished prepolish compound is a heavy, white, viscous liquid. The prepolish is used in a wipe on-wipe off procedure.

As will now be recognized, an improved metal polish has been disclosed in which the viscosity is advantageously controlled to uniformly disperse the abrasive particles such that clumping is prevented and a wetting agent is provided to assist in complete wetting of the metal surface during application of the polish. The formulation may be varied to also provide a scratch remover and a prepolish compound.

Although specific formulations of the metal polish have been disclosed for exemplary purposes, various changes using equivalent ingredients and percentages of ingredients may be made without departing from the spirit and scope of the invention.

I claim:

1. A metal polishing compound comprising:
    tall oil fatty acid in an amount in the range of 30% to 65% by weight;
    oleic diethanol amide in an amount in the range of 2% to 10% by weight;
    aluminum oxide having particle sizes in the range of 0.1 to 1.0 microns in an amount in the range of 30% to 60% by weight; and
    organo-treated bentonite in an amount in the range of 1% to 3% by weight.
2. A scratch removing compound for metal comprising:
    tall oil fatty acid in an amount in the range of 30% to 65% by weight;
    oleic diethanol amide in an amount in the range of 2% to 10% by weight;
    aluminum oxide having particle sizes in the range of 0.1 to 1.0 microns in an amount in the range of 30% to 60% by weight;
    water in an amount in the range of 15% to 30% by weight; and
    organo-treated bentonite in an amount in the range of 1% to 3% by weight.
3. The compound as defined in claim 2, in which said aluminum oxide includes particles of 19 grit.
4. A prepolish compound comprising:
    mineral spirits in an amount of essentially 55% by weight;
    oleic diethanol amide in an amount of essentially 6.7% by weight;
    aluminum oxide having particle size of 19 grit in an amount of essentially 15% by weight; and
    organo-treated bentonite in an amount of essentially 1.5% by weight.

* * * * *